United States Patent [19]

Ninomiya et al.

[11] Patent Number: 4,949,168
[45] Date of Patent: Aug. 14, 1990

[54] DECODING EQUALIZER

[75] Inventors: Yuichi Ninomiya, Kawasaki; Yuichi Iwadate, Komae, both of Japan

[73] Assignee: Nippon Hoso Kyokai, Tokyo, Japan

[21] Appl. No.: 246,195

[22] Filed: Sep. 19, 1988

[30] Foreign Application Priority Data

Sep. 25, 1987 [JP] Japan ................................ 62-238891
Dec. 19, 1987 [JP] Japan ................................ 62-320077

[51] Int. Cl.$^5$ ............................................. H04N 7/12
[52] U.S. Cl. .................................. 358/21 V; 358/138; 358/141
[58] Field of Search ...................... 358/21 V, 139, 138, 358/140, 141

[56] References Cited

U.S. PATENT DOCUMENTS 4,621,286 11/1986 Reitmeier et al. .................... 358/141
4,661,839 4/1987 Plantholt et al. ............... 358/21 VX
4,800,427 1/1989 Plantholt ........................ 358/21 VX

FOREIGN PATENT DOCUMENTS 62-172826 7/1987 Japan.

OTHER PUBLICATIONS

"An HDJV Broadcasting System Utilizing a Bandwidth Compression Technique-MUSE", IEEE Transaction, vol. BC-33 #4; Dec. '87; Ninomiya et al.; pp. 130–160.
Patent Abstracts of Japan; vol. 12 #13; Jan. '80.

*Primary Examiner*—Howard W. Britton
*Assistant Examiner*—Victor R. Kostak
*Attorney, Agent, or Firm*—Antonelli, Terry, Stout & Kraus

[57] ABSTRACT

A decoding equalizer of high definition television signal transmission mode, such as MUSE, and a subrange-type A/D converter suitable for the equalizer. The decoding equalizer samples input data in equalization at a frequency twice the sampling frequency of the trunk system, with the equalizing A/D converter operating at a lower resolution and higher speed than the A/D converter for the trunk system. The subrange-type A/D converter includes A/D converters in multiple stages, with their driving clock frequencies having a specified relationship so that they are used commonly for the A/D conversdion of the high definition television signal and the A/D conversion of a test signal for detecting the transmission characteristics.

15 Claims, 9 Drawing Sheets

DECODING EQUALIZER

BACKGROUND OF THE INVENTION

1. Field of the Invention

This invention relates to a decoding equalizer for a sampled value transmission system of high definition television signal, such as MUSE (Multiple Sub-Nyquist Sampling Encoding) system, and to a subrange-type A/D converter used for the decoding equalizer and suited to implement the automatic equalization of the transmission characteristics of the transmission system.

2. Description of the Related Art

The conventional technique for equalizing the transmission path characteristics for the transmission of sampled values produced by offset sampling, such as in the MUSE system, employs standard receivers on the part of the receiver and implements pre-equalization by an encoder on the part of the transmitter so that the receivers have satisfactory reproduction characteristics. However, this technique fails in the achievement of effective pre-equalization if there exists the variability of characteristics among the standard receivers. Another problem is that it necessitates distinct equalization when supplying a signal to different information media such as a BS (broadcasting satellite) system and a 22 GHz ground system.

In the technique of automatic equalization of transmission characteristics for the analog signal transmission of high definition television signal, in which a certain unit impulse signal is inserted as a test signal in the television signal and the characteristics of the transmission path is detected through the subsequent signal processing as disclosed in JP-A-62-172826, it necessitates an A/D converter of 16.2 MHz clock rate for the trunk system and an A/D converter of 32.4 MHz clock rate for the equalizing system.

SUMMARY OF THE INVENTION

An object of this invention is to provide a decoding equalizer capable of equalizing an offset sampled signal to meet invariably satisfactory characteristics on the part of the receiver.

Another object of this invention is to provide a decoding equalizer which has a simple circuit arrangement and involves easy circuit design.

A further object of this invention is to provide a subrange-type A/D converter used for the above-mentioned decoding equalizer and operative to implement both the A/D conversion of the television signal and the A/D conversion of the test signal for automatic equalization without increasing the complexity of the circuit arrangement.

The invention resides in a decoding equalizer used for a transmission system in which a high definition television signal is sampled at a specified frequency, a sampled value and a test signal for detecting the characteristics of a transmission path are transmitted, the sampled value is decoded with a decoder, and the transmission path characteristics are equalized by using the test signal, the equalizer comprising first sampling means which samples the sampled value at a frequency twice the specified sampling frequency, second sampling means which samples the sampled value at the specified sampling frequency, filter means which filters the output signal of the first sampling means to produce a correction value for correcting the transmission distortion of a transmitted high definition television signal, adding means which adds a delayed version of the output signal from the second sampling means to the output signal of the filter means, extracting means which extracts the test signal from the output signal of the adding means, and arithmetic means which receives data pertinent to the test signal provided by the extracting means and calculates an error based on prepared reference data to determine the correction value of the filter means based on the calculated error, and repeats the data reception, error calculation and correction value determination until the error becomes smaller than a predetermined value.

The invention also resides in a subrange-type A/D converter used for a transmission system in which the high definition television signal is sampled at a specified sampling frequency, a sampled value and a test signal for detecting the transmission path characteristics are transmitted, the sampled value is decoded with a decoder, and the transmission path characteristics are equalized by using the test signal, wherein a plurality of A/D converters are connected in multiple stages, with the fore-stage A/D converter having a driving clock frequency which is a multiple of a driving clock frequency of the back-stage A/D converter.

DESCRIPTION OF THE PREFERRED EMBODIMENTS

Embodiments of this invention will be described in detail with reference to the drawings.

The embodiments will be described by referring to an example of the MUSE transmission system developed for the high definition television signal, which is an analog signal transmission system for transmitting the analog signal obtained by offset sampling between frames, fields and lines.

Figure 1:
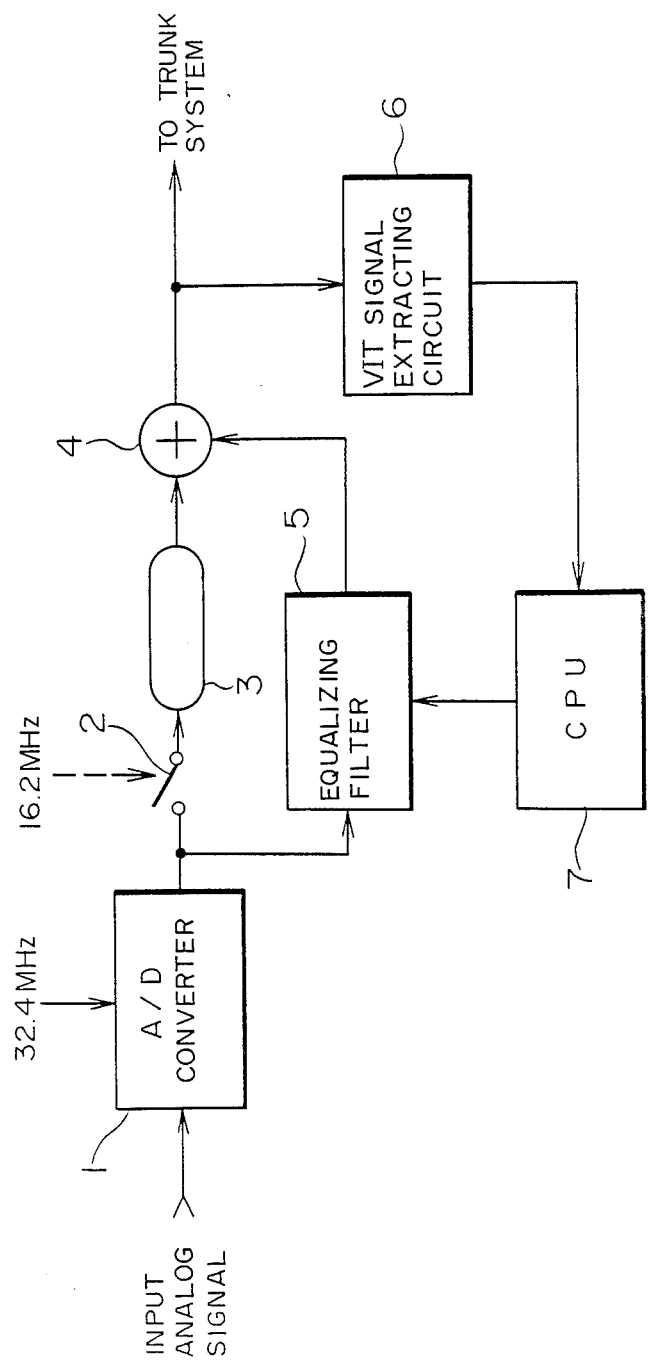
FIG. 1 is a block diagram showing the first embodiment of the inventive decoding equalizer.

FIG. 1 is a block diagram showing an embodiment of the inventive decoding equalizer. In FIG. 1, indicated by element 1 is an A/D converter which samples the input analog signal in a MUSE system at a frequency of 32.4 MHz. Element 2 is a sub-sampling circuit which converts the output signal of the A/D converter 1 into a signal of a trunk sampling clock rate of 16.2 MHz (or Ms/s: mega-samples per second). Element 3 is a delay circuit, and element 4 is an adder. Element 5 is an equalizing filter with a variable tap, and is used to produce an equalization correction value. Element 6 is a VIT signal extraction circuit which extracts the VIT (Vertical Interval Test) signal with an impulse response waveform for measuring the distortion of the transmission path by being inserted in advance in the trunk system signal. Element 7 is a CPU which receives signal waveform data provided by the signal extraction circuit 6 and compares it with stored ideal waveform data to evaluate the distortion, and controls the variable tap of the equalizing filter 5 so that it produces the equalization correction value. The correction value is added to the trunk system signal by the adder 4, and the transmission characterictics of the transmission line are equalized.

Figure 4:
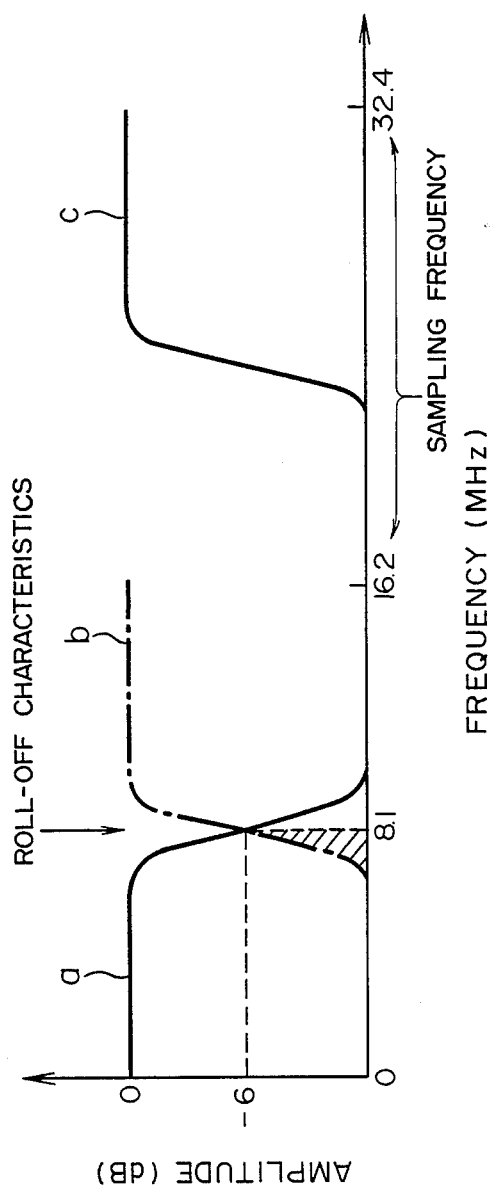
FIG. 4 is a diagram explaining the sampling rate required for the equalization of MUSE system.

The trunk system of the MUSE system has a sampling clock rate of 16.2 MHz, while the equalization system operates at a sampling clock rate of 32.4 MHz. FIG. 4 is a diagram explaining the sampling clock rate necessary for the equalization of MUSE mode. As shown in FIG. 4, sampling at 16.2 MHz with the intention of producing the 8.1 MHz roll-off characteristics (a) will result in a fold-over of the higher range above the cutoff frequency 8.1 MHz on the characteristics (b) as shown by hatching. This fold-over can be avoided by the sampling at 32.4 MHz which is twice the 16.2 MHz, and the sampling rate required for equalization is accomplished.

Figure 2:
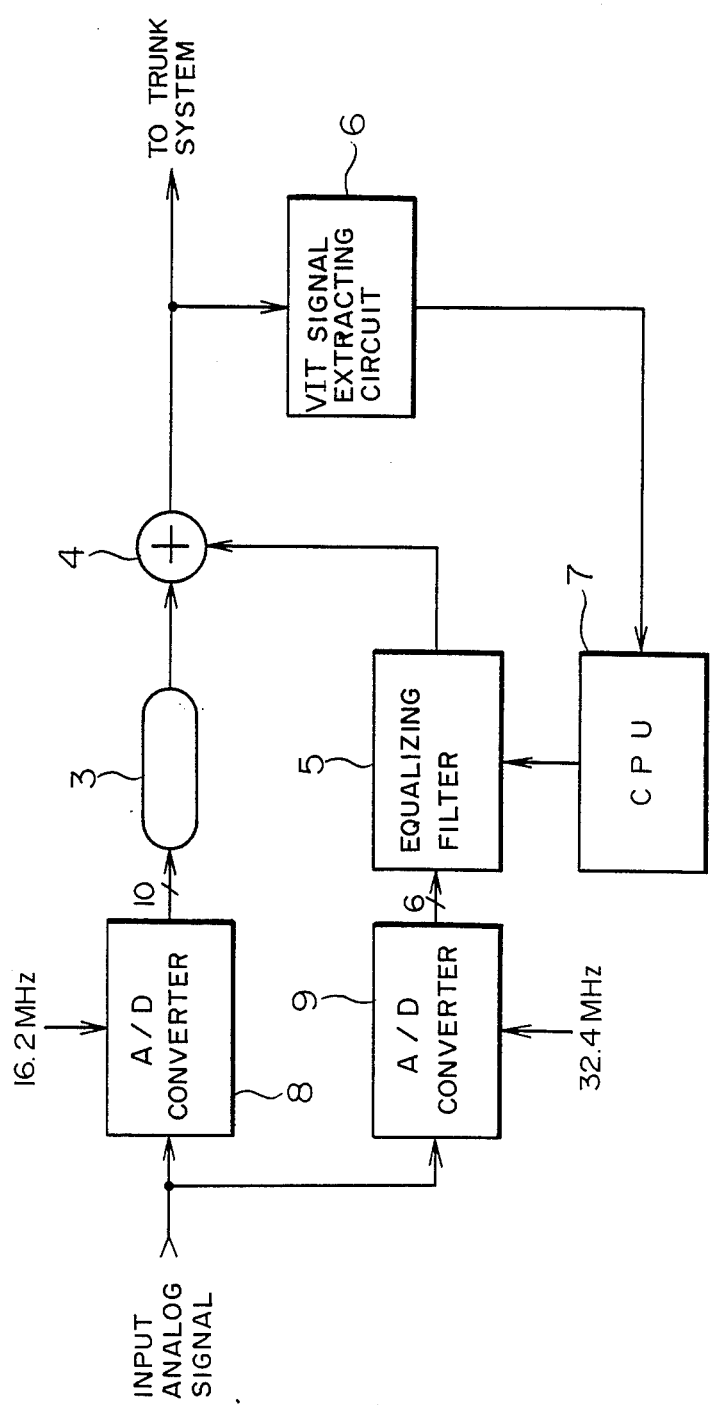
FIG. 2 is a block diagram showing the second embodiment of the inventive decoding equalizer.

FIG. 2 is a block diagram showing another embodiment of the inventive decoding equalizer. In FIG. 2, components identical to those of FIG. 1 are referred to by the same symbols, and their explanation will not be repeated. Indicated by 8 is an A/D converter which samples the input signal at 16.2 MHz, and its output signal is used for the trunk system. Element 9 is an A/D converter which samples the input signal at 32.4 MHz, and it is used as a circuit component of the equalization system.

The arrangement shown in FIG. 2 allows the A/D converter 9 for the equalization system, which is formed as a branch path of the trunk system, to have a resolution of 6 bits at most. The equalization filter 5 is conceivably required to have the ability to process a 6-bit signal at most, provided that it does not conduct a d.c. component. A problem seems to arise in the phase difference between the A/D converter 9 for the equalization system having a 6-bit resolution and the A/D converter 8 for the trunk system, but it is avoided completely through the adoption of the iterative correcting operation in the equalization system loop and by suppressing the phase difference below 1/5 of clock period. The above-mentioned iterative method enables equalization on the part of the decoder to have less equalization volume, and provides the characteristics of the digital circuit after equalization that are deemed ideal, whereby the arrangement is simplified considerably.

Figure 3:
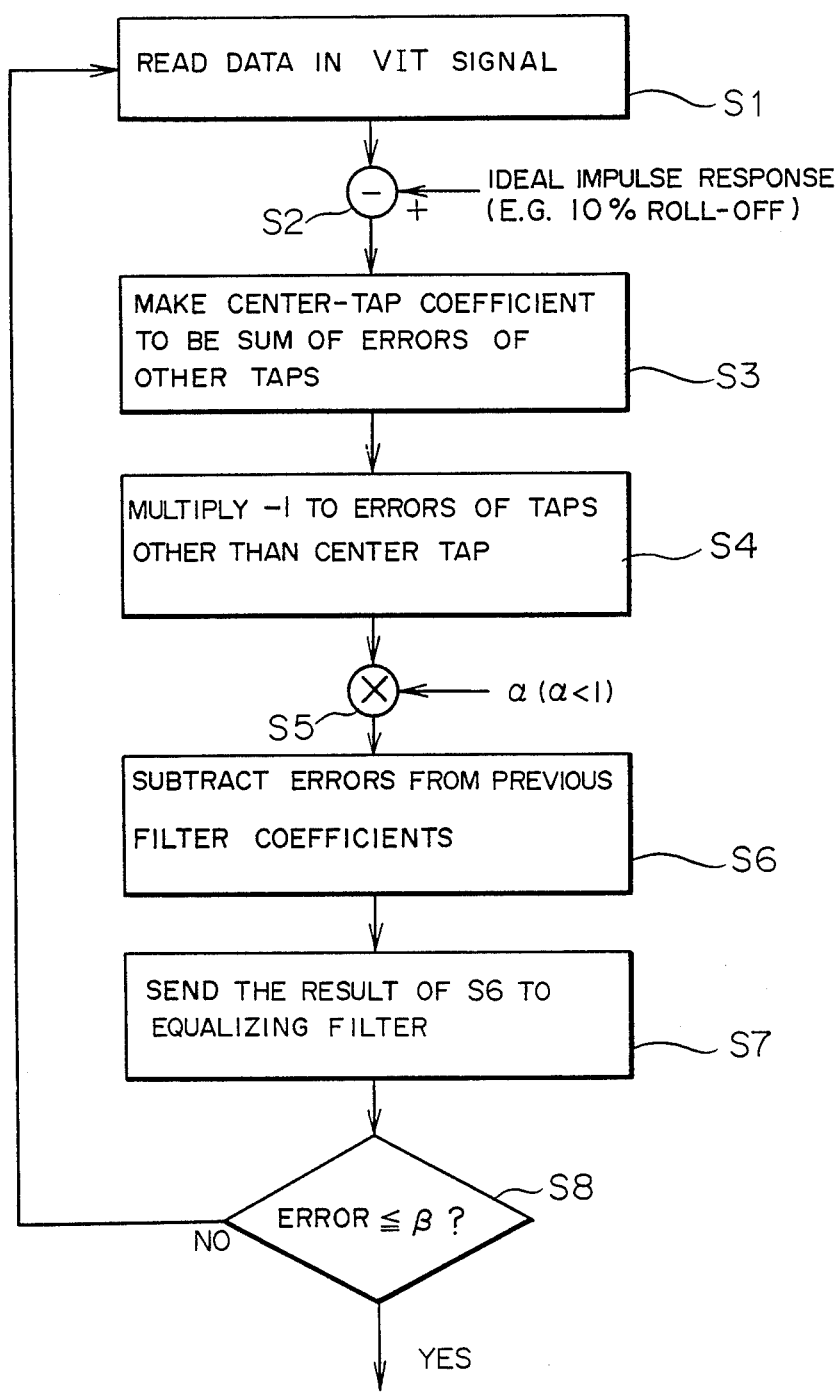
FIG. 3 is a flowchart showing the operation of the CPU shown in FIGS. 1 and 2.

FIG. 3 is a flowchart showing the process carried out by the CPU shown in FIGS. 1 and 2. In the flowchart of FIG. 3, step S1 reads data in the VIT signal by means of the VIT signal extraction circuit 6, and the data is delivered to the CPU 7. Step S2 subtracts the extracted data from data of ideal impulse response, which has been stored in advance in the CPU 7, to evaluate the error. Step S3 causes the variable-tapped equalizing filter 5 to have a center-tap coefficient equal to the sum of errors of other than the center tap. Step S4 multiplies −1 to the errors of these taps. Consequently, the equalizing filter 5 has a zero gain, and it does not make a d.c. variation in the trunk system. Step S5 multiplies α (α<1) to the error values for obviating the possibility of oscillation in the equalizing operation. Step S6 subtracts the error from the filter coefficient which has been evaluated previously. Step S7 sends the error data to the variable tap of the equalizing filter to control the filter. At step S8, the above operations are repeated until the error value is smaller than the predetermined value 8. The state of convergence is determined solely on the basis of the error of the 16.2 MHz data, as indicated in the step S8, i.e., the sampled value which is read originally as a signal of the MUSE mode.

Figure 5:
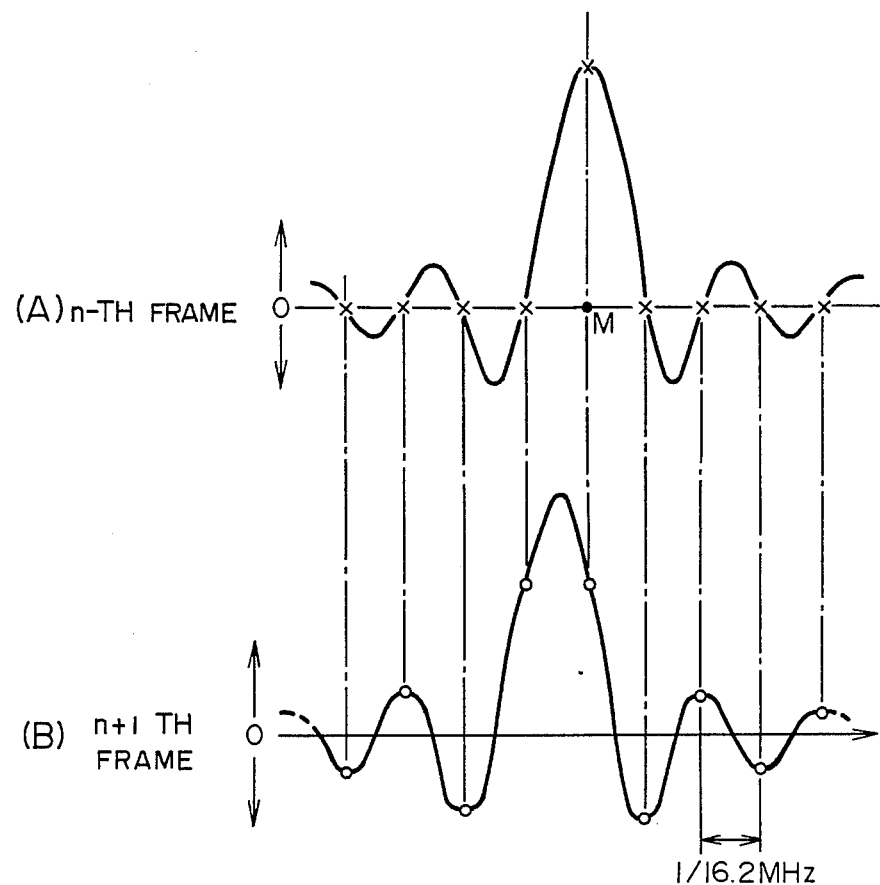
FIG. 5 is a waveform diagram showing, as an example, the test signal.

The VIT signal will be described in more detail. FIG. 5 is a waveform diagram showing, as an example, the VIT signal of the MUSE signal. Shown by (A) in FIG. 5 is the impulse response waveform for the n-the frame, while (B) is that for the n+1 the frame. The waveform of (A) has a peak (marked by x) at the center point M, and the amplitude of oscillation decreases progressively as the position goes right or left away from the M point. The response characteristics have zero-cross points at a constant interval on the horizontal axis as indicated by marks "x".

The waveform of (B) has maximum values at two positions in the central portion in correspondence to the "x" positions of (A) and has peaks of amplitude for the remaining "x" positions, as indicated by marks "o".

Accordingly, by combining the waveforms of (A) and (B) in FIG. 5 data which is sampled at 32.4 MHz is obtained. A signal with a completely equal waveform is reproduced if the transmission system has no distortion. The presence of distortion in the transmission system creates a distortion in the impulse response waveform and creates error in the values at the "x" and "o" positions.

The VIT signal extraction circuit 6 in FIGS. 1 and 2 supplies the impulse response waveform data to the CPU 7, which controls the equalizing filter 5 for the waveform equalization.

Incidentally by the way, in the embodiment shown in FIG. 2, for example, for implementing the equalization on the part related to the decoder, the following two points of practical problems must be overcome.

(1) Conflict in equalization between the decoder and the encoder when it is carried out on the part of the encoder.

(2) Creation of flaw in the trunk system signal when loading data from CPU 7 into equalizing filter 5.

Regarding item (1), an iteration flag indicative of equalization in progress on the part of the encoder is provided so that the equalizing operation does not take place on the part of the decoder while it is in progress on the part of the encoder.

Regarding item (2), two possible methods exit . One method is that two sets of equalizing filters 5 are prepared, with data being preloaded to the one unused for the trunk system, and the filters are switched such that the loaded equalizing filter is inserted in the trunk system. The other method is that the output of the equalizing filter is made zero and equalization is inhibited while data is being loaded. Although the latter method involves a momentary period in which equalization is suspended during data loading, this does not cause the d.c. level to vary and therefore it is virtually unnoticeable.

Figure 6A:
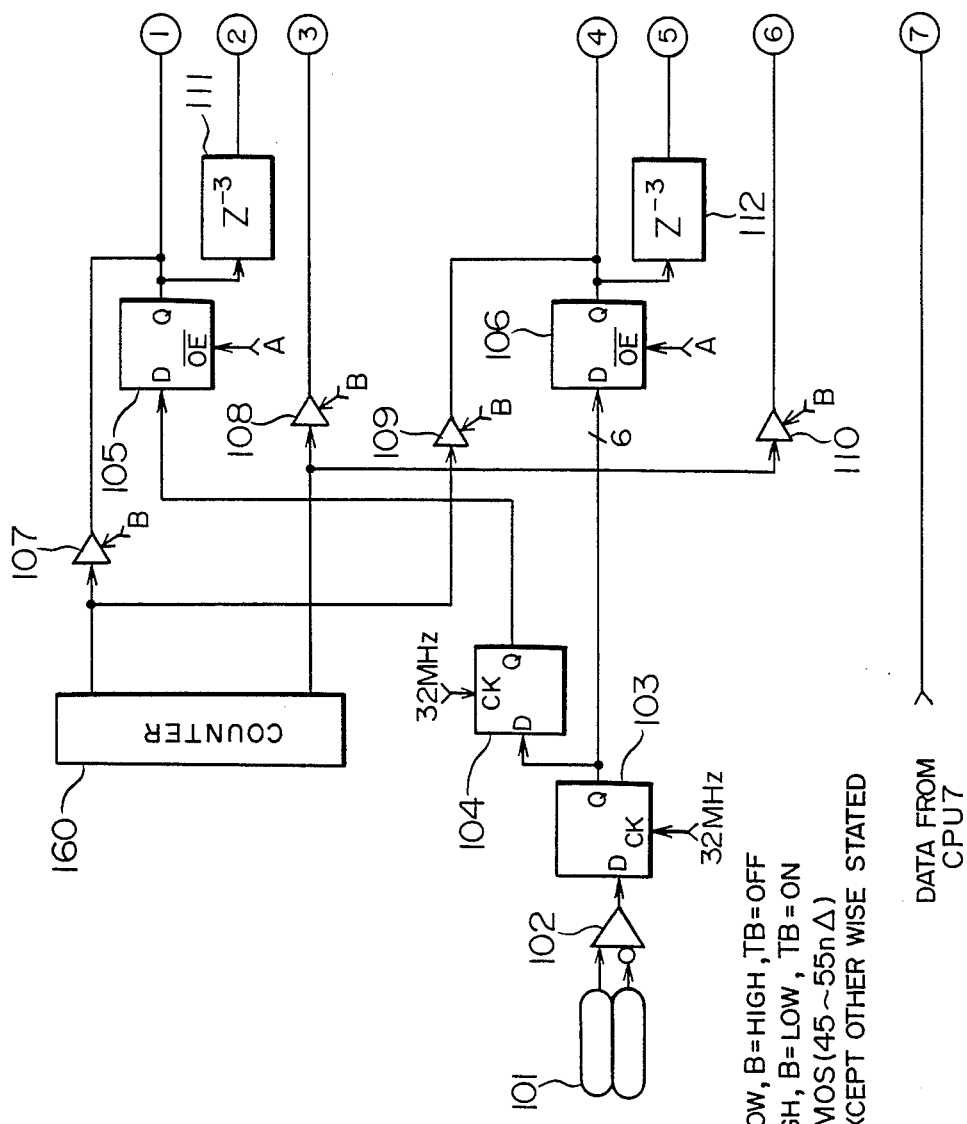
FIGS. 6A and 6B are block diagrams showing, as examples, the arrangement of the equalizing filter.
Figure 6B:
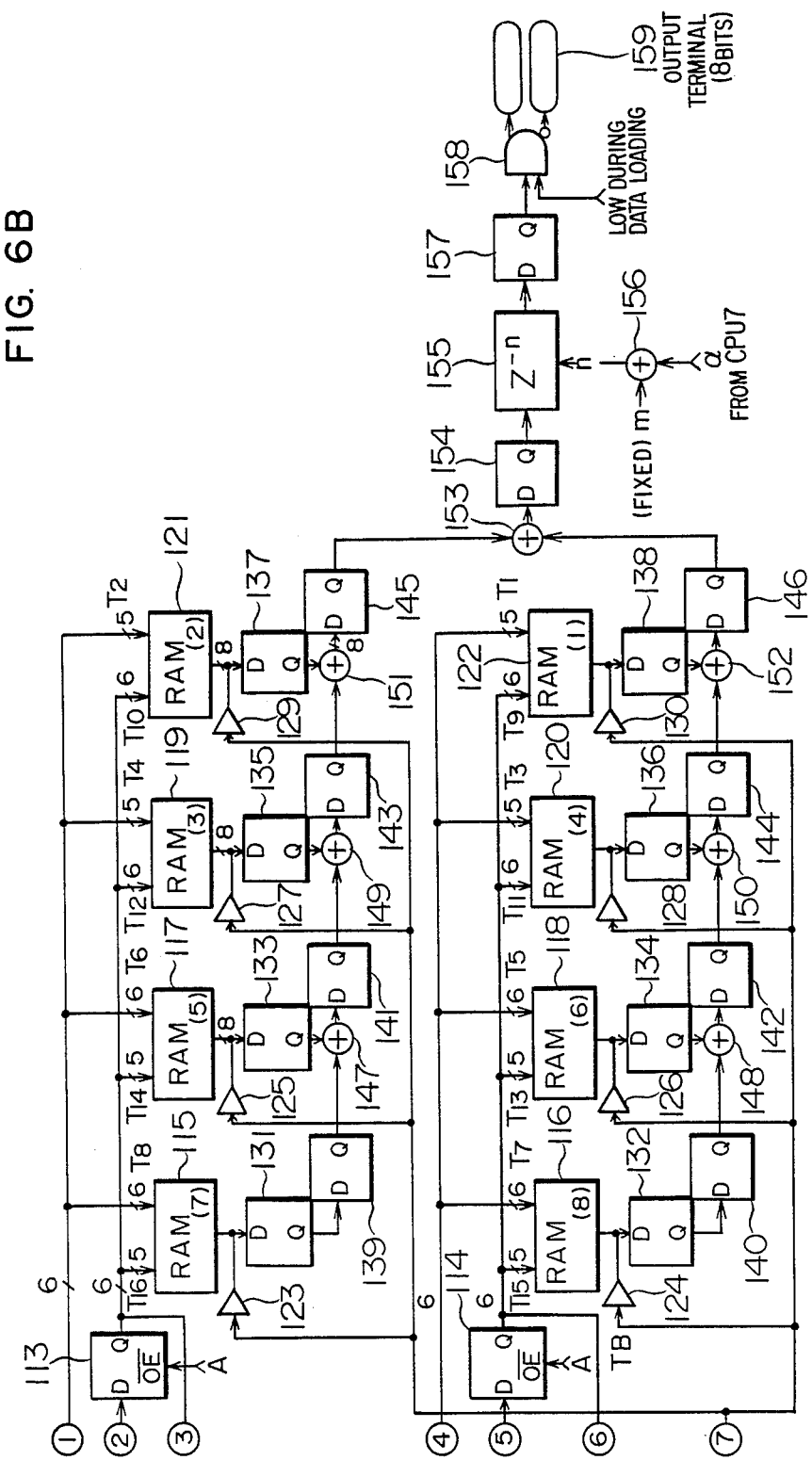

FIGS. 6A and 6B are block diagrams showing, as an example, the arrangement of the variable-tap equalizing filter 5 shown in FIGS. 1 and 2. The circuits of both figures in unison form a single circuit by being connected through terminals to 1 to 7. In FIGS. 6A and 6B, indicated by element 101 is an input terminal and element 102 is a line receiver. Element 103–106, 113, 114, 131–146, 154 and 157 are flip-flops each used to delay the signal by one 32 MHz clock period. 107–110 and 123–130 are 3-state buffers, providing the output of "0", "1" or "open". Elements 111 and 112 are delay circuits used to delay the signal by three 16 MHz clock periods. Elements 115–122 are 11-bit RAMs, 147–153 and 156 are adders, and element 155 is a delay circuit for delaying the signal by n 16 MHz clock periods (n≦128). Element 158 is an AND gate and 159 is an output terminal. Element 160 is a counter which generates the write address for the RAMs 115–122.

The RAMs, 3-state buffers, flip-flops and adders are combined in groups, e.g., 121, 129, 137, 145 and are 151, and connected in series to form a basic structure of a variable-tap equalizing filter as a whole. The filtering characteristics are determined by the coefficients of the RAMs 118–122, and the variable-tap filter has its characteristics variable by changing the RAM coefficients with the CPU 7.

Through the retardation for one 32 MHz clock period by the flip-flop 104 in FIG. 6A, taps T2, T4, T6, T8, T10, T12, T14 and T16 on the upper section are separated from taps T1, T3, T5, T9, T11, T13 and T15 on the lower section, and they operate at a 16 MHz clock.

The delay circuit 155 and adder 156 are combined to produce a delay of n 16 MHz clock periods (n—128), and the timing relation between the trunk system and equalizing filter system can be adjusted. Namely, the CPU 7 executes control such that the center tap (T8 or T9) of the filter is placed at the point where the VIT signal waveform has a maximum ringing.

The counter 150 generates the address for loading data from the CPU 7 into the RAMs 115–122. When the CPU 7 is loading data into the RAMs, the AND gate 158 produces a low output to invalidate the output of the equalizing filter 5, and equalization for the trunk system is inhibited temporarily.

As described above, the equalizing filter of this embodiment has less number of bits (6 bits) for the input, and therefore it is relatively simple. A 11-bit RAM is used for two taps, and the filter having a total of 16 taps is formed. Taps dealing with the central portion of the VIT signal have 6-bit inputs, while taps for the remote portions have 5-bit inputs. In this embodiment, it is possible to choose the tap positions for the central portion of the equalizing filter, allowing the use by setting the tap position to be corrected.

Figure 7:
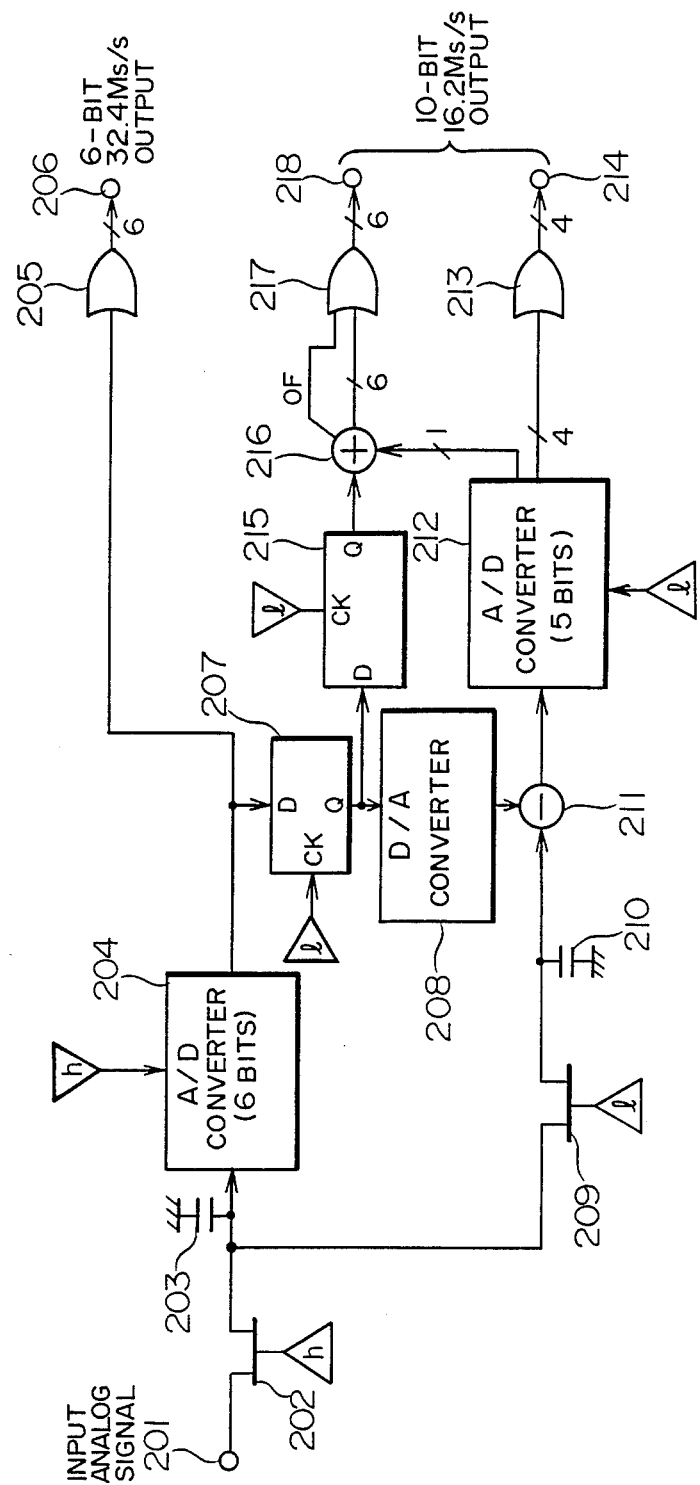
FIG. 7 is a block diagram showing the overall arrangement of the subrange-type A/D converter suitable for the inventive equalizer.
Figure 8:
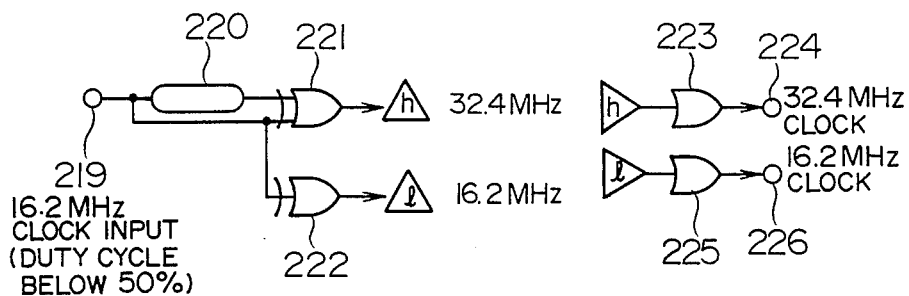
FIGS. 8 and 9 are block diagrams showing circuit sections added to the subrange-type A/D converter.
Figure 9:
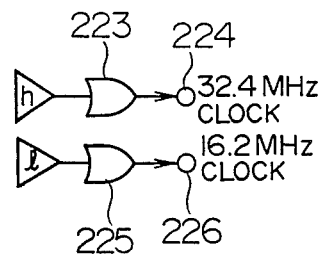

FIGS. 7, 8 and 9 show, as an example, the arrangement of the subrange-type A/D converter suitable for the foregoing decoding equalizer. The conventional subrange-type A/D converter generally includes two A/D converters of 16 MHz clock rate and 32 MHz clock rate, whereas the inventive subrange-type A/D converter covers the A/D conversion for both the VIT signal and high definition television signal, resulting in a smaller scale of circuit.

Generally, each A/D conversion stage of the subrange-type A/D converter needs to operate faster than the operating speed of the overall converter. It is relatively easy to design a high-speed A/D converter with a relatively low resolution, e.g., bits or less. Accordingly, a high-resolution A/D converter of around 10 bits used for the subsampling transmission of high definition television signal is arranged favorably in the subrange type with each A/D conversion stage having a resolution of 6 bits or less, whereby a high-speed, high-resolution A/D converter is realized relatively simply.

The subrange-type A/D converter of this embodiment utilizes the above-mentioned advantages of subrange type. As shown in FIG. 7, the fore-stage A/D converter 204 for converting the high-order 6 bits out of 10-bit conversion output digital signal, for example, has its driving clock rate set to 32.4 MHz twice the television signal sampling clock rate 16.2 MHz for the trunk system, and the back-stage A/D converter 212 for converting the low-order 5 bits has its driving clock rate left unchanged at 16.2 MHz, so that the 32.4 MHz A/D converter 204 is used commonly for the conversion of upper digits of television signal and the formation of the signal for correcting the transmission characteristics. Accordingly, the A/D converter of this embodiment is capable of high-speed A/D conversion at as high resolution as around 10 bits, for example, and the accuracy of A/D conversion is determined from the input to the back-stage A/D converter 212. Eventually, the accuracy is determined by the A/D converter 212 driven at a 16.2 MHz clock rate, and therefore it is identical to the conventional subrange-type A/D converter operating at a 16.2 MHz clock rate for both the fore-stage and back-stage.

Next, the arrangement and operation of the A/D converter shown in FIG. 7 will be explained. Clock pulses of 32.4 MHz and 16.2 MHz for driving the upper and lower conversion stages, respectively, are produced as shown in FIG. 8. A clock generator (not shown) provides on a terminal 219 a clock of 16.2 MHz having a duty cycle below 50%, which is fed to an exclusive-OR gate 211 directly and also through a delay element 200, and a 32.4 MHz clock is produced at the output of the gate 221. The 16.2 MHz clock is delivered through another exclusive-OR gate 222. The 32.4 MHz and 16.2 MHz clocks are fed through respective OR gates 223 and 225, and led out of the converter on output terminals 224 and 226 for external uses, as shown in FIG. 9.

Figure 10:
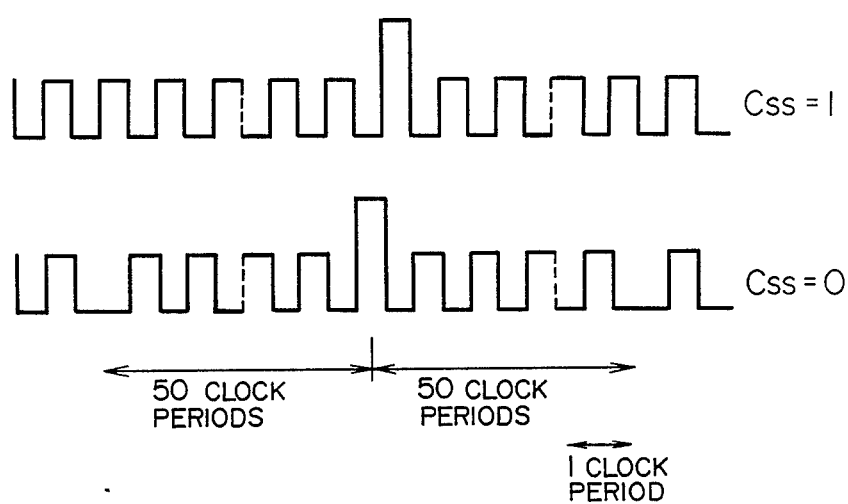
FIG. 10 is a waveform diagram showing, as an example, the unit impulse waveform signal for equalization.
Figure 11:
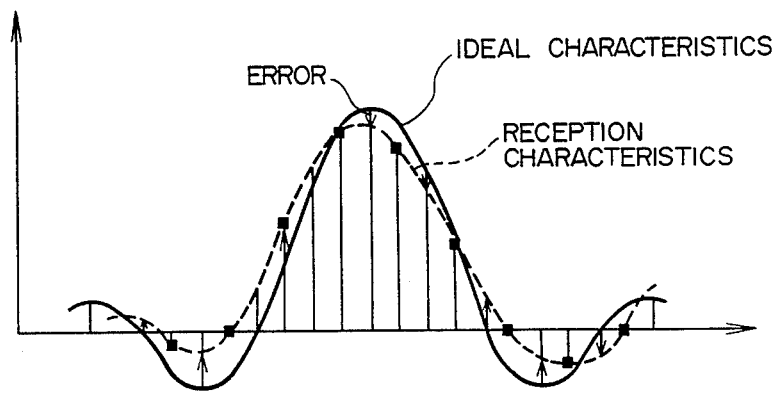
FIG. 11 is a waveform diagram showing, as an example, the reception conversion waveform for equalization.

In the subrange-type A/D converter shown in FIG. 7, an analog input signal such as the high definition television signal on the input terminal 201 is introduced to a sampler 202, by which the signal is sampled by the 32.4 MHz clock supplied on the clock terminal h. The sampled signal level held by a capacitor 203 for one sampling period is fed to the A/D converter 204, by which the voltage level is converted into a high-order 6-bit digital signal by being driven by the 32.4 MHz clock supplied on the clock terminal h. The high-order 6-bit digital signal is led out through an OR gate 205 on an output terminal 206 as a digital test waveform signal at a 32.4 MHz clock rate made up of unit impulses as shown in FIG. 10 which is an example of the digital test waveform signal against the analog test signal having a waveform shown in FIG. 11 applied to the input terminal 201.

The high-order 6-bit conversion output signal of 32.4 MHz provided by the fore-stage A/D converter 204 is fed to a flip-flop 207 driven by the 16.2 MHz clock so that the signal is converted to have a 16.2 MHz clock rate, and it is converted back to an analog signal by a D/A converter 208 and fed to a subtractor 211. The subtractor 211 has another input receiving a signal which is derived from the analog input signal on the input terminal 201, which is sampled at the 16.2 MHz clock by a sampler 209 and held by a capacitor 210 for one sampling period. Accordingly, the subtractor 211 produces a differential analog signal which is the analog input signal subtracted by the analog signal equivalent to the high-order conversion digital signal, and the differential analog signal is fed to the backstage A/D converter 212 driven by the 16.2 MHz clock supplied on the clock terminal 1, thereby producing a 5-bit low-order conversion digital signal.

In the illustrated circuit arrangement, which is intended to convert an analog input signal into a 10-bit digital signal, it is sufficient for the lower conversion stage to produce a low-order 4-bit digital signal left aside from the 6-bit conversion output produced by the upper conversion stage. However, there is little difference in the complexity and easiness of fabricating each A/D conversion stage of up to 6 bits, and therefore the A/D converter 212 is designed to have a 5-bit resolution, with its low-order 4 bits providing the lower conversion output at a 16.2 MHz clock rate through an OR gate 213 and output terminal 214 and with its highest 1 bit providing a carrier or borrower to an adder 216. The adder 216 also receives the output of the flip-flop 207 through another flip-flop 215 driven by the 16.2 MHz clock. The 6-bit high-order digital signal at the 16.2 MHz clock rate added by the carrier or borrower bit from the A/D converter 212 is fed to an OR gate 217 together with an overflow bit OF from the adder 216, and the OR gate 217 delivers the high-order 6-bit conversion output digital signal at 16.2 MHz clock rate to the output terminal 218.

The subrange-type A/D converter arranged as described above, in fact, forms an arrangement which embodies the circuit section of the A/D converter 1 and subsampling circuit 2 included in the decoding equalizer shown in FIG. 1. The subrange-type A/D converter has on its terminals 214 and 218 the output signals at the trunk system sampling rate delivered to the delay circuit 3, and the output signal at the equalization system sampling rate on the terminal 206 is delivered to the equalizing filter 5.

It is possible for the A/D converter shown in FIGS. 7, 8 and 9 to be modified variously as in conventional subrange-type A/D converters. For example, in the illustrated arrangement, the output digital signal from the fore-stage A/D converter is converted to the low-rate digital signal with the flip-flop 207 and then converted back to the analog signal with the D/A converter 208, whereas the high-order output digital signal of 32.4 MHz from the A/D converter 204 may be converted back to the analog signal directly with the D/A converter 208. Instead of subtracting the analog signal produced by the D/A converter 208 from the input analog signal on the input terminal 201 with the subtractor 211, the back-converted analog signal is added to the reference level of the A/D converter 212 and, in this state, the input analog signal on the input terminal 201 is fed directly to the A/D converter 212 so that their difference is rendered A/D conversion. For the back-stage A/D converter 212, five bits are used to obtain the low-order 4-bit conversion output, i.e., the dynamic range twice as needed, and conceivably such an excessive range need not be afforded.

Regarding the clock rate, only the low-rate clock is supplied and it is multiplied within the converter as shown in FIG. 8, but instead both the 16.2 MHz and 32.4 MHz clocks may be supplied from separate clock sources, although the illustrated scheme is more preferable for the avoidance of possible influence of the phase relation between the clocks on the conversion characteristics. The number of stages of A/D converters is not confined to two stages, but any plurality of stages is possible.

We claim:

1. A decoding equalizer for a transmission system which samples a high definition television signal at a specified sampling frequency, transmits a sampled value and a test signal for detecting transmission characteristics of a transmission path, decodes the sampled value with a decoder, and equalizes the transmission characteristics of the transmission path using the test signal, the decoding equalizer comprising:
   first sampling means which samples the sampled value at a sampling frequency twice the specified sampling frequency said first sampling means providing an output signal;
   second sampling means which samples the sampled value at the specified sampling frequency, said second sampling means providing an output signal;
   filter means which filters the output signal of the first sampling means and produces a correction value for correcting a transmission distortion of the high definition television signal;
   adding means which adds a delayed version of the output signal of the second sampling means to an output signal of the filter means, said adding means providing an output signal;
   extracting means which extracts the test signal from the output signal of the adding means; and
   artithmetic means which receives data pertinent to the test signal extracted by the extracting means, calculates an error of the data with respect to predetermined reference data, determines the correction value produced by the filter means based on the calculated error, and repeats the operations of data reception, error calculation and correction value determination until the error becomes smaller than a predetermined value.

2. A decoding equalizer according to claim 1, wherein the second sampling means is formed as a sum-sampling circuit and is located at a following stage of the first sampling means.

3. A decoding equalizer according to claim 1, wherein the first sampling means and the second sampling means are in parallel.

4. A decoding equalizer according to claim 1, wherein the filter means produces a correction value exclusive of a d.c. component.

5. A decoding equalizer according to claim 1, wherein the second sampling means and the filter means are supplied with sampled value data of the same resolution, said filter means neglecting a low-order bit of the sampled value data.

6. A decoding equalizer according to claim 1, wherein the filter means is supplied by the first sampling means with data, which is lower in resolution than data supplied to the second sampling means produced by a fast A/D converter.

7. A decoding equalizer according to claim 1, wherein the test signal is a reference impulse signal and the correction value produced by the filter means is produced such that the reference impulse signal has predetermined ideal characteristics.

8. A decoding equalizer according to claim 1, wherein an output signal of the filter means is made to be zero during a period when the arithmetic means is determining the correction value.

9. A decoding equalizer according to claim 1, wherein the filter means comprises first and second sets of filter means, which are used alternately by switching, such that while the first set of filter means perform a filtering operation, the second set of filter means implements data loading.

10. A decoding equalizer according to claim 1, wherein an equalizing operation by the decoder does not take place when an iteration flag indicates that equalization by the encoder is being executed.

11. A subrange-type decoder equalizing A/D converter for a transmission system which samples a television signal at a specified sampling frequency, transmits a sampled value and a test signal for detecting transmission characteristics of a transmission path, decodes the sampled value with a decoder, and equalizes the transmission characteristics of the transmission path using the test signal, wherein the subrange-type decoder equalizing A/D converter is a multi-stage subrange-type decoder equalizing converter comprising fore-stage and back-stage A/D converters connected sequentially in a plurality of stages, the fore-stage A/D converter having a driving clock frequency which is a multiple of a driving clock frequency of the back-stage A/D converter.

12. A subrange-type decoder equalizing A/D converter according to claim 11, wherein the multi-stage subrange-type decoder equalizing A/D converter consists of two stages.

13. A subrange-type decoder equalizing A/D converter according to claim 12, wherein the fore-stage A/D converter has a 32.4 MHz driving clock frequency and the back-stage A/D converter has a 16.2 MHz driving clock frequency.

14. A subrange-type decoder equalizing A/D converter according to claim 11, wherein the back-stage A/d converter is provided with a resolution in excess of a theoretically required minimum resolution, the resolution in excess being used for correcting a total conversion output digital value.

15. A subrange-type decoder equalizing A/D converter according to claim 11, wherein the multi-stage subrange-type decoder equalizing A/D converter consists of more than two stages.

* * * * *